United States Patent [19]

Kroko

[11] Patent Number: 4,759,626
[45] Date of Patent: Jul. 26, 1988

[54] DETERMINATION OF BEST FOCUS FOR STEP AND REPEAT PROJECTION ALIGNERS

[75] Inventor: Catherine G. Kroko, Corvallis, Oreg.

[73] Assignee: Hewlett-Packard Company, Palo Alto, Calif.

[21] Appl. No.: 928,482

[22] Filed: Nov. 10, 1986

[51] Int. Cl.4 .................................................. G01B 9/00
[52] U.S. Cl. .................................... 356/124; 356/125
[58] Field of Search .................... 356/123, 124, 124.5, 356/125, 126, 127, 372

[56] References Cited

U.S. PATENT DOCUMENTS 4,585,342 4/1986 Lin et al. ............................. 356/124

*Primary Examiner*—Gene Wan
*Assistant Examiner*—James C. Lee
*Attorney, Agent, or Firm*—S. A. Kassatly; Bloor Redding, Jr.

[57] ABSTRACT

A reticle design is provided for step and repeat projection aligners which, when patterned on a wafer (10), allows quick macroscopic evaluation of best focus for used in fabricating integrated circuits. The reticle pattern consists of opaque lines and spaces of widths slightly above the resolution limit of the resist/aligner system. The macroscopic determination of best focus, being macroscopically visible, eliminates the need for microscopic determination, thereby providing a quick and easy method. The best focus determination is made by forming an array (22) of resist fields (14') on the wafer, subjecting each field to a different focus and exposure. Upon development, those fields away from the best focus and at the larger exposure doses will be removed, leaving a parabola (24) of fields whose apex (26) is at high exposure. Best focus is the focus setting used to print the row of fields (B) containing the apex. The procedure may be used at different lens locations and reticle orientations to quantify lens aberrations and field tilt. The method of the invention is also suitably used to qualitatively and quantitatively diagnose and characterize the lens, by printing full fields (34) with varying focus. In this manner, lens astigmatism and curvature and field tilt can be mapped, measured, and understood.

13 Claims, 3 Drawing Sheets

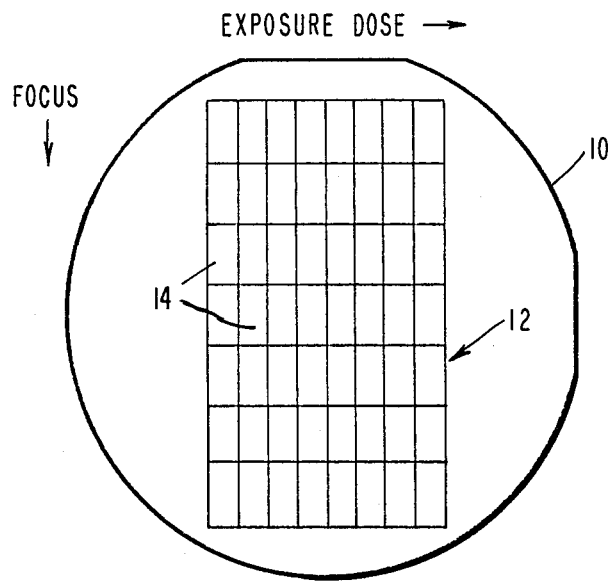
Fig. 1. (PRIOR ART)
Fig. 2. (PRIOR ART)
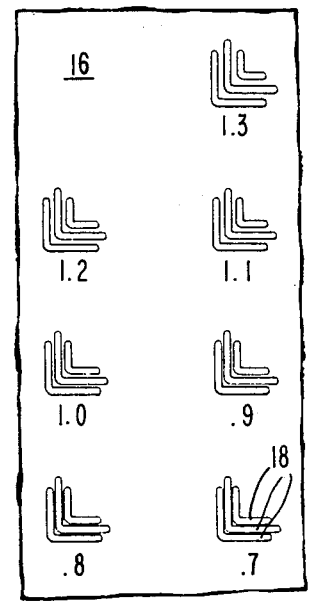
Fig. 3. (PRIOR ART)

DETERMINATION OF BEST FOCUS FOR STEP AND REPEAT PROJECTION ALIGNERS

TECHNICAL FIELD

The present invention relates to step and repeat projection aligners, commonly used in processing wafers to fabricate integrated circuits (ICs) thereon, and, more particularly, involves the determination of best focus, which is employed in wafer processing runs to expose and pattern resist films on wafers.

For lens characterization, relative best focus across a stepper's lens is a measure of lens and system problems (field tilt and curvature, and astigmatism) that can reduce the focus budget of a photolithography process.

BACKGROUND ART

A stepper aligner system geometry typically comprises in order a light source, aperture blades, a reticle, a lens and finally the wafer. Adjustable aperture blades or blinds mask light from passing through parts of the reticle and lens so that less than the maximum field can be exposed on the wafer.

"Best focus" is the focus setting used on a step and repeat projection aligner that will provide the steepest resist sidewall slope and thus the best resolution and linewidth control. The stepper focus setting corresponds to the adjustable distance between the wafer surface and the reticle/lens.

In conventional focus determination, one or more sets of resolution targets in each of 25 to 80 fields, each exposed at incrementally different focus and exposure combinations, are evaluated microscopically (at 200× to 500× magnification). The nominal dimension of the smallest resolved feature is recorded on a data sheet. The matrix of numbers forms nested parabolas (curves of constant dimension) whose low exposure apexes define "best focus". Underexposure of positive photoresist provides the several parabolas for consideration. The error of this method is estimated to be ±0.75 μm. A typical time to complete this qualification and determine the best focus value is about 25 to 30 minutes.

A more accurate method of interpretation of such a focus exposure matrix is to actually measure critical dimension bars in each field. Best focus is found at the center of the smallest bars resolved. However, this method is even more time consuming than that described above.

The foregoing procedure is commonly undertaken at the beginning of a work shift, and thus production is held in abeyance pending determination of best focus. Also, any changes that occur during the shift that could change best focus, such as barometric pressure changes or certain equipment maintenance procedures, can require that a redetermination of best focus be made.

For lens characterization, the procedure is similar, except that a maximum size field is exposed at different focus settings, and resolution bars are read at five or more locations on each field. For each location, the date comprising the nominal size of the smallest resolved resolution bars versus focus form a parabola whose apex is at best focus for that location. The difference in best focus values for different areas is caused by field curvature and lens tilt. The difference in best focus values for horizontal and vertical lines is due to astigmatism. Both must be accommodated in the process focus budget.

Limitations of the prior art lens characterization method include (1) accuracy limited by local resist, underlying film, and exposure variations at the site of the resolution bars, (2) operator fatigue limited by the number of locations that can be tested, so that a complete lens map can only be estimated, and (3) time requirements of the method and the replication of the test to verify results.

A need remains for a method of determining the best focus at one or more locations in a more rapid manner.

DISCLOSURE OF INVENTION

In accordance with the invention, a method of determining best focus from a focus/exposure matrix is provided. The method comprises forming a two-dimensional matrix of fields of resist on the surface of a wafer comprising varying exposure in one dimension and varying focus in the other. Such a patteren is commonly referred to as a focus exposure matrix.

The resist is then developed, and a parabola is obtained, the apex of which is at high exposure. Best focus is the focus setting used to print the row containing the apex, or, if the apex is between rows, interpolation is used.

Only those matrix rows near best focus will actually print resolved lines and spaces in columns of increasing exposure. Away from best focus, and at larger exposure doses, the projected image will have insufficient contrast to resolve the lines and spaces, so that all resist will be exposed and developed away. After development, the resulting parabola, whose apex is at high exposure, is macroscopically defined by the present or absence of resist.

A reticle pattern comprising a plurality of opaque lines and spaces of widths slightly wider than the resolution limit of the resist/aligner system is also provided in accordance with the invention.

Resolution in focus choice to 0.25 μm can be readily achieved with a matrix of 0.5 μm focus steps. The method of the invention allows quick macroscopic evaluation of best focus; the typical time to macroscopically choose best focus on a 16×16 array is about 30 to 60 seconds. While the time required to expose the larger array is about 2.5 minutes longer than by the prior art method, a savings in terms of total time (9.5 minutes versus 25 to 30 minutes for the microscopic approach) more than compensates for the additional exposure time.

Also in accordance with the invention, an extension of the above method, using the same reticle pattern for quantifying focus variation across the field, is provided. To measure best focus at different locations on the field the reticle is masked to print only the area of the field to be tested. An over-exposed focus/exposure matrix is printed. The procedure is repeated after changing the masking to expose different areas of the lens. Each wafer provides a best focus value for that location. The reticle can be turned so that best focus can be determined independently for sagittal and tangential line. (The difference between these is due to astigmatism.)

A method of obtaining a global "picture" of relative focus across the whole field simultaneously is to unmask the reticle so the whole filed will be printed, and print a focus matrix at a constant high exposure. The developed wafer(s) will macroscopically display a progression of zones that are in and out of focus (as evidenced by the amount of photoresist remaining) at different focus settings. An overlay of the fields exposed at different focus values contains topographical information about the field. This method can be used to identify problem areas for further testing with SEM (scanning electron microscope) or other techniques.

BRIEF DESCRIPTION OF THE DRAWINGS

FIG. 1 is a top plan view of a wafer, showing the arrangement of a typical 8×7 matrix of resist fields employed by the prior art microscopic technique;

FIG. 2 is an enlargement (500×) of a portion of a field, showing resolution bars;

FIG. 3 is a matrix of numbers representing the smallest resolution bars resolved under microscope, the matrix corresponding to the matrix of resist fields on the wafer in FIG. 1;

BEST MODES FOR CARRYING OUT THE INVENTION

A. Best Focus

Figure 4:
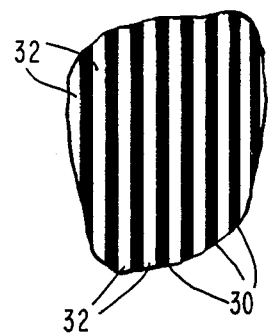
FIG. 4 is a plan view of a portion of a reticle layout used in the practice of the invention.

1. Conventional Method.

Referring now to the drawings, wherein like numerals of reference designate like elements throughout, a wafer 10 is shown in FIG. 1, supporting a matrix 12 of resist fields or elements 14 in an 8×7 array. The matrix of fields has been exposed in a conventional step and repeat projection aligner (not shown), with exposure varied in the X-direction (horizontal) and focus varied in the Y-direction (vertical) and developed. As is conventional, the wafer 10 is "stepped" to permit exposure of a field 14 of resist at an adjacent location, employing a different set of focus and exposure conditions.

In this prior art approach, the reticle employed conveniently comprises at a number of locations throughout the recticle, a standard resolution bar cell 16. A particle example of such a cell 16 is shown in FIG. 2, with sets of three nested L-shaped bars 18 having decreasing spacing, for example, from 1.3 to 0.7 μm, as indicated.

An operator examines a set of resolution bars in each field 14 under a microscope (500×) and finds the smallest set of resolved bars 18 in which no resist material remains between the bars. In the example depicted in FIG. 2, this is the set at 0.9 μm.

The operator enters these values on a tabulation matrix 20, illustrated in FIG. 3, arranged identical to the array of unique fields of FIG. 1. After inspecting and tabulating data from each of the 56 fields 14, a pattern of nested parabolas (of constant resolved pattern size) is discerned, with each parabola's apex indicating the same best focus. In the example depicted in FIG. 3, the best focus is seen to be at 260, as indicated by the arrow denoted "A". The operator would set the focus of the column of the projection aligner at that value, and processing of wafers would be performed at that value throughout the day (except for small offsets specific to device and process level), unless the operator suspected that focus had shifted for some reason (such as a barometric pressure change or equipment maintenance work). Then, the foregoing procedure would be undertaken again.

A typical time to interpret a conventional 8×7 focus exposure matrix microscopically and extract the best focus value is fifteen to twenty minutes. Total processing time (reticle loading, stepping the wafer and exposing the resist, developing the resist, and reading the wafer) is about 25 to 30 minutes.

2. The Invention.

In accordance with the invention, an improved method of determining best focus is provided. In this method, an array 22 of elements 14' is formed on the wafer 10 by the same step and repeat procedure outlined above, varying focus along one direction and exposure along the other. Here, as above, exposure is varied along the horizontal direction, while focus is varied along the vertical direction. The array depicted is 16×16 for convenience; other size arrays may be employed, depending on the extend of resolution desired.

The nature of the wafer 10 employed in the practice of the invention is not critical. When best focus has been determined, the resist remaining may be stripped off with a variety of common methods, and the wafer used again for best focus determination or porcessed for forming ICs thereon.

A layer of resist is applied, conventiently the same resist used in production. The resist is conventionally applied by spinning, to a thickness ranging from about 8,000 Å to 15,000 Å, typically about 12,000 Å. If the resist is too thick, then it will be difficult to resolve small dimensions. Advantageously, the thickness of the resist is chosen to be in the same range as that employed in production.

Next, a reticle is used to pattern the resist, and aperture blades or blinds mask the field of the projection aligner down to the desired field size. For example, fields of 5 mm square may be employed, with 4 mm steps. The smaller the steps, the better the focus resolution attainable, and the longer the wafer exposure will take.

A reticle layout has been developed to be used in the practice of the invention. As shown in FIG. 4, the reticle pattern comprises a plurality of opaque lines 30, preferably chrome, and spaces 32 of widths slightly above the resolution limit of the resist/aligner system. Preferably, the widths range from about 1 to 25% above the resolution limit. The width of the lines 30 and spaces 32 presently is such as to provide lines on the wafer ranging from 1 to 1.2 μm and spacing ranging from about 0.8 to 1.0 μm. However, as the technology advances and smaller line widths and spacing can be printed, the lower limit of line width and spacing may be reduced.

For example, one reticle pattern used comeprised chrome lines 6 μm wide and spaced 5 μm apart to print lines approximately 1.1 μm on a 5× stepper (at nominal or typical exposure). The resolution limit for the resist-/aligner system in this case was about 0.9 μm. The long parallel lines extend across a 5 inch quartz reticle so that fields of any size up to about 20 mm diameter can be printed on a 5× stepper, depending upon the application. Of course, for a 1× or 10× stepper, the reticle line size spacing and maximum field size would vary accordingly. In any event, the line and space widths depend on the resist/aligner capabilities, and simple experimentation will reveal the optimum combination for a specific set of conditions.

Optionally, resolution bar cells, similar to those depicted in FIG. 2, may be included for microscopic quantification of resolution. However, such bar cells are not needed in the practice of the invention, since no microscopic examination is involved in best focus determination.

Following step-wise exposure, the resist is developed in a conventional developer. (If sufficient coarse focus steps and high exposures are used, the latent image evident before developing may be adequate to judge best focus.) For example, for AZ1512 positive photoresist, an aqueous solution of sodium hydroxide is used, as is conventional. Again, the developer is keyed to that exployed in production, as is the method of developing (for example, spray or dip).

Figure 5:
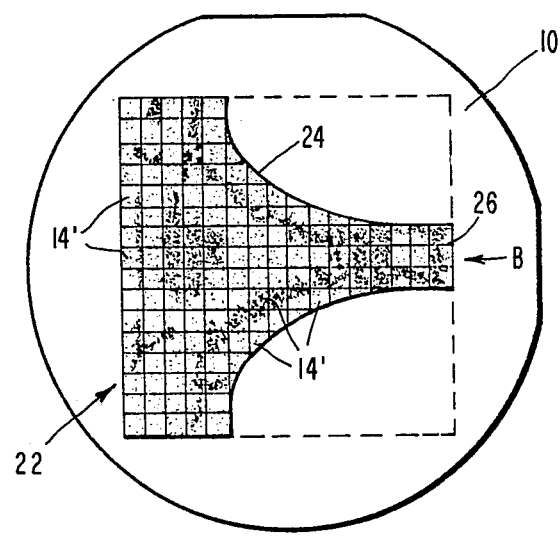
FIG. 5 is a plan view of a wafer, depicting an example of best focus determination, employing a 16×16 matrix of resist fields, utilizing the method of the invention.

As a result of the foregoing process steps, a parabolic pattern, similar to that depicted at 24 in FIG. 5, emerges.

The best focus is determined by the presence or absence of resist on portions of the wafer, not by measurement or by some subjective assessment of "resolution". The method of the invention is seen to exploit focus as a parameter which causes macroscopically visible, highly contrasted profiles. Thus, the method is referred to herein a the "Macro Focus method" of determining best focus.

The governing concept is that only those matrix rows near best focus will actually print resolved lines and spaces in columns of increasing exposure. Exposures may range from nominal to several times nominal.

Away from best focus, and at larger exposure doses, the projected image will have insufficient contrast to resolve the lines and spaces, so all resist will be exposed and developed away. After development, the resulting parabola 24, whose apex 26 is at high exposure, is macroscopically defined by the presence or absence of resist, as shown in FIG. 5. Best focus is the focus setting used to print the row containing the apex, as indicated by the arrow denoted "B". If the apex is between rows, interpolation is used. Resolution in focus choice to 0.25 $\mu$m is readily achievable with a matrix of 0.5 $\mu$m focus steps.

The particular focus range selected depends upon the accuracy required for the process. The particular exposure range selected depends upon the size of the lines and spaces and the develop parameters. The closer the line/space size is to the minimum printable, the less over-exposure will be necessary to cause the parabola 24 to end in a peak 26.

The typical time to macroscopically choose best focus on a 16×16 array is 30 to 60 seconds. The total processing time is about 9.5 minutes, or about $\frac{1}{3}$ the total time to determine best focus microscopically.

The method of the invention provides several advantages in addition to speed. First, no microscope is required, thus eliminating a tedious task. Second, since the method is less subjective, training of personnel is easier. Third, the method described herein permits increased resolution in foucs determination; that is, smaller focus steps can be readily employed without an accompanying increased evalution time or effort. Fourth, data suggests improved accuracy over the conventional microscopic method due to the larger area under consideration and the consequently reduced sensitivity to local resist thickness and film variations, contamination, etc.

Additional interpretation can be placed on the appearance of the printed matrix. Particles on the back of the wafer produce a dramatic bullseye pattern across several adjacent fields. Chuck or reticle tilt or a non-flat wafer is evidenced by a jagged pattern of partial field clearing. Autofocus inconsistency due to system problems or wafer irregularities, such as laser scribed identification, show up as fields which do not show a logical similarity to neighboring fields.

B. Lens Characterization

1. Partial Field—Quantitative.

In further accordance with the invention, the foregoing methods described for use in determining best focus can be extended to allow characterization of other areas of the field than the center, which is typically used to determine "best focus".

Wafer type and processing are the same as above, except in the manner of use of the reticle described above.

To measure field curvature and tilt, the reticle is masked so that only a portion of the lens will be used. A focus exposure matrix is exposed as above and best focus chosen for that area. Subsequently, different protions of the lens are unmasked and the procedure repeated, in a minimum of five lens locations total, each on a separate wafer. Best focus is thus determined for different parts of the lens. The magnitude of the tilt is extracted by looking for linear variations in the best focus values across the lens. The magnitude of the field curvature is extracted by looking for second order variations, after the linear components are removed, in the best focus values across the lens.

To measure astigmatism at any location, the above procedure is supplemented by using the reticle in two orthogonal orientations (for example, horizontal and vertical) so that individual best focus values are obtained for sagittal and tangential lines. The difference at each location between best focus for sagittal and tangential lines is the magnitude of the astigmatism there.

It is known that the larger the field, the larger the through-put of wafers in production. However, the larger the field, the more area of the lens is being used, and thus the greater the likelihood that areas of the lens having significant deviations from ideal flat focus characteristics will be used for printing of critical circuit features. The foregoing analysis can determine if and where such lens problems exist, so that steps can be taken to correct such problems as field tilt, and partially compensate or avoid areas having aberrations that cannot be corrected, such as field curvature or astigmatism.

2. Full Field—Quantitative/Qualitative.

Also in accordance with the invention, the full field may be simultaneously tested on one wafer per desired reticle orientation, by varying focus but keeping exposure at a constant value. This process is equivalent to taking a vertical slice (constant exposure column) through the parabola used for best focus determination.

Wafer type and processing are the same as above, except in the manner of the use of the reticle described above.

Figure 6:
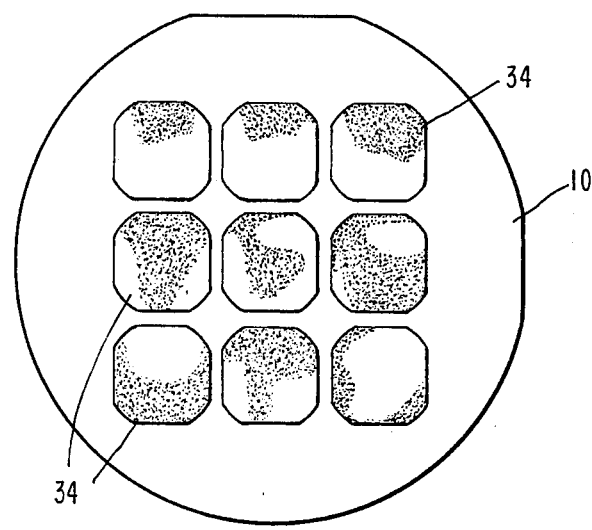
FIG. 6 is a plan view of a wafer, showing the presence of a 3×3 matrix to evaluate the properties of the lens used in a step and repeat projection aligner.
Figure 7:
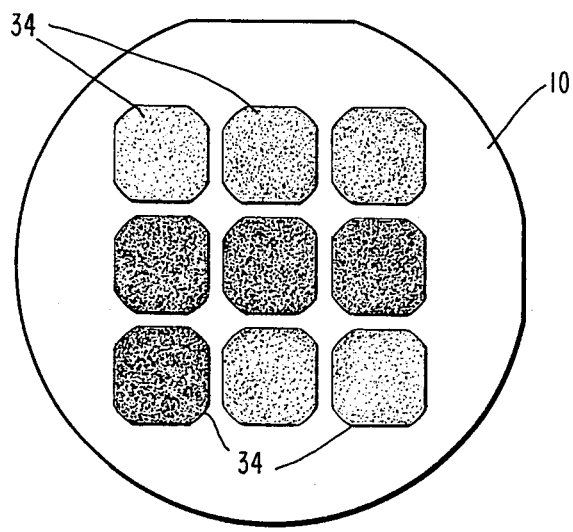
FIG. 7 is a plan view similar to that of FIG. 6, but depicting an ideal result, with no field curvature or tilt.

To print the maximum field through the whole available lens area, the aperture blades are adjusted to unmask the reticle. On a 4-inch wafer at 5×, about 9 full fields 34 (20 mm diameter) can conveniently be exposed, as shown in FIGS. 6 and 7. After developing the wafer, a progression of views will be apparent, wherein zones that are near focus will have resist, and zones that are out of focus will not (given an appropriate exposure that will make this contrast evident over the focus range tested). Bright color fringes visible on the wafer strongly accentuate lens focal plane distortions. An example of such distortions is depicted in FIG. 6, where stippling is employed to represent the color fringes.

The sequence of fields, if overlayed, would yeild a topographical map of focus across the lens. If astigmatism is present, wafers exposed with the reticle's lines running one direction will show a different pattern than wafers processed identically except that the reticle was turned so that the lines ran in the orthogonal direction. Exposing two wafers thus isolates and accentuates the astigmatism. (Exposing one wafer with two half-time orthogonal exposures of the lined reticle described above, or exposing one wafer with a reticle having both directions of lines overlayed on it would yield a wafer displaying the average best focus, so that astigmatism could not be determined.)

The presence or absence of resist and bright color fringes can be used to extract quantitative field distortion in several minutes, compared to hour(s) (the time required by the conventional method depends on the number of locations tested).

In the ideal case, with flat lens characterization, the amount of resist would be uniform across the field 34 at any given focus setting and no fringes would be evident because the whole field is in focus at the same focus setting. In subsequent fields, as the focus goes further from ideal, the amount of resist should decrease uniformly, with a fading appearance. Best focus is in the field where the most resist remains, as indicated by the highest concentration of stippling in FIG. 7 or the center of the fields having equivalent amounts of resist.

INDUSTRIAL APPLICABILITY

The method of the invention is useful in establishing best focus in step and repeat projection aligners used to process wafers for fabricating integrated circuits and in characterizing a lens in such aligners.

Thus, there has been disclosed a method for determination of best focus and relative best focus for step and repeat projection aligners. A reticle design has been provided for use in the practice of the invention. Many changes and modifications will be apparent to those of ordinary skill in the art and may be made without deviating from the spirit and scope of the invention, and all such changes and modifications are considered to be within the scope of the invention as defined by the appended claims.

What is claimed is:

1. A method for macroscopically determining best focus of a projection aligner from a focus/exposure matrix, comprising:
    (1) forming a layer of resist on a wafer, said resist and said aligner comprising a resist/aligner system having a given resolution limit;
    (2) forming a two-dimensional matrix of resist fields on a polished side of a flat surface of said wafer, employing a reticle comprising a plurality of opaque lines and clear spaces of widths slightly above said resolution limit, by sequentially projecting light or other electromagnetic radiation through said reticle, field by field, while varying exposure along one axis and varying focus along a second axis orthogonal to said first axis, thus transferring multiple images of said reticle into said resist;
    (3) developing said resist so that either exposed or unexposed resist will be removed to obtain a parabolic pattern of lined resist fields whose axis and apex lie along the axis of focus, with resist being completely removed during said developing from over-exposed and out-of-focus fields on either side of said parabola; and
    (4) obtaining from the position of said apex on said focus axis an indication of said best focus.

2. The method of claim 1 wherein said apex is on a row of constant focus and best focus is that value.

3. The method of claim 1 wherein said apex is between two rows of constant focus, and best focus is obtained by interpolating between said two rows.

4. A reticle design for use in step and repeat projection aligners used in conjunction with exposing a layer of resist on a wafer, said resist and said aligner comprising a resist/aligner system having a given resolution limit, said reticle design which, when patterned in a resist layer on a wafer, allows quick macroscopic evaluation of best focus, said reticle design comprising a plurality of opaque lines and clear spaces of widths slightly above said resolution limit of said resist/aligner system.

5. A method of macroscopically diagnosing and characterizing a lens in a step and repeat projection aligner to quantify aberrations and tilt thereof comprising:
    (1) forming a layer of resist on a wafer, said resist and said aligner comprising a resist/aligner system having a given resolution limit;
    (2) forming a two-dimensional matrix of resist fields on a polished side of a flat surface of said wafer, employing a reticle comprising a plurality of opaque lines and clear spaces of widths slightly above said resolution limit, by sequentially projecting light or other electromagnetic radiation through said reticle, field by field, while varying exposure along one axis and varying focus along a second axis orthogonal to said first axis, thus transferring multiple images of said reticle into said resist;
    (3) developing said resist so that either exposed or unexposed resist will be removed to obtain a parabolic pattern of lined resist fields whose axis and apex lie along the axis of focus, with resist being completely removed during said developing from over-exposed and out-of-focus fields on either side of said parabola;
    (4) determining from the position of said apex on said focus axis an indication of best focus; and
    (5) repeating Steps (1) through (4) at other locations on said lens, by masking said reticle to a field size smaller than the full field and desired lens locations, on additional wfers, whereby any difference in best focus across the field indicates the presence of at least one of aberrations and tilt.

6. A method of macroscopically diagnosing and characterizing a lens in a step and repeat projection aligner to quantify lens tilt thereof comprising:
    (1) forming a layer of resist on a wafer, said resist and said aligner comprising a resist/aligner system having a given resolution limit;
    (2) forming a two-demensional matrix of resist fields on a polished side of a flat surface of said wafer, employing a reticle comprising a plurality of opaque lines and clear spaces of widths slightly above said resolution limit, by sequentially projecting light or other electromagnetic radiation through said reticle, field by field, while varying exposure along one axis and varying focus along a second axis orthogonal to said first axis, thus transferring multiple images of said reticle into said resist;

(3) developing said resist so that either exposed or unexposed resist will be removed to obtain a parabolic pattern of lined resist fields whose axis and apex lie along the axis of foucs, with resist being completely removed during said developing from over-exposed and out-of-focus fields on either side of said parabola;

(4) determining from the position of said apex on said focus axis an indication of best focus; and (5) repeating Steps (1) through (4) at at least five locations on the field by masking said reticle to a smaller field size and desired lens locations, on additional wafers, whereby the magnitude of lens tilt may be extracted by looking for linear variations in said best focus values across said lens.

7. A method of macroscopically diagnosing and characterizing a lens in a step and repeat projection aligner to quantify field curvature thereof comprising:
   (1) forming a layer of resist on a wafer, said resist and said aligner comprising a resist/aligner system having a given resolution limit;
   (2) forming a two-dimensional matrix of resist fields on a polished side of a flat surface of said wafer, employing a reticle comprising a plurality of opaque lines and clear spaces of widths slightly above said resolution limit, by sequentially projecting light or other electromagnetic radiation through said reticle, field by field, while varying exposure along one axis and varying focus along a second axis orthogonal to said first axis, thus transferring multiple images of said reticle into said resist;
   (3) developing said resist so that either exposed or unexposed resist will be removed to obtain a parabolic pattern of lined resist fields whose axis and apex lie along the axis of focus, with resist being completely removed during said developing from over-exposed and out-of-focus fields on either side of said parabola;
   (4) determining from the position of said apex on said focus axis an indication of best focus; and
   (5) repeating Steps (1) through (4) at at least five locations on the field by masking said reticle to a smaller field size and desired lens locations, on additional wafers, whereby the magnitude of field curvature may be extracted by looking for second order variations, after removing linear components, in said best focus values across said lens.

8. A method of macroscopically diagnosing and characterizing a lens in a step and repeat projection aligner to quantify astigmatism thereof comprising:
   (1) forming a layer of resist on a wafer, said resist and said aligner comprising a resist/aligner system having a given resolution limit;
   (2) forming a two-dimensional matrix of resist fields on a polished side of a flat surface of said wafer, employing a reticle comprising a plurality of opaque lines and clear spaces of widths slightly above said resolution limit, by sequentially projecting light or other electromagnetic radiation through said reticle, field by field, while varying exposure along one axis and varying focus along a second axis orthogonal to said first axis, thus transferring multiple images of said reticle into said resist;
   (3) developing said resist so that either exposed or unexposed resist will b removed to obtain a parabolic pattern of lined resist fields whose axis and apex lie along the axis of focus, with resist being completely removed during said developing from over-exposed and out-of-focus fields on either side of said parabola;
   (4) determining from the position of said apex on said focus axis an indication of best focus;
   (5) repeating Steps (1) through (4) with said reticle aligned in different orientations to supply information about sagittal and tangential components; and
   (6) repeating Steps (1) through (5) at different locations on said lens by masking said reticle to a smaller field size and desired lens locations, on additional wafers, whereby the magnitude of astigmatism at any lens location is detemined by the difference between best focus in two orthogonal directions, sagittal and tangential.

9. A method of macroscopically diagnosing and characterizing a lens in a step and repeat projection aligner by viewing the whole field simultaneously to quantify aberrations and tilt thereof comprising:
   (1) forming a layer of resist on a wafer, said resist and said aligner comprising a resist/aligner system having a given resolution limit;
   (2) forming a matrix of maximum-sized resist fields on a polished side of a flat wafer employing a reticle comprising a plurality of opaque lines and clear spaces of widths slightly above said resolution limit of said resist/aligner system, by sequentially projecting light or other electromagnetic radiation through said reticle, field by field, while varying exposure and keeping focus constant, thus transferring an image of said reticle into said resist;
   (3) developing said resist so that either exposed or unexposed resist will be removed, to obtain a sequence of fields, some of which are nearly completely covered with a lined resist pattern and some of which are nearly free of all resist;
   (4) determining for any location the focus value of the center of said fields having resist present at that location, which is an indication of best focus for said location;
   (5) repeating said determination at all desired locations;
   (6) exposing additional wafers for all reticle orientations desired and repeating Steps (1) through (5) to obtain additional values of best focus; and
   (7) comparing the various best focus values obtained, whereby astigmatism is determined by the difference in best focus at any location between best focus for sagittal and tangential lines resulting from reticle orientations and whereby tilt is determined as the linear component of the variation in average of sagittal and tangential best focus across the lens and whereby field curvature is determined by any second order variation remaining after removal of said linear component.

10. A reticle design for use in step and repeat projection aligners which, when patterned in a resist layer on a wafer, allows quick macroscopic evaluation of best focus, said reticle design comprising a plurality of opaque lines and clear spaces of widths slightly above a resolution limit of the resist/aligner system.

11. The reticle design of claim 4 wherein said widths range from about 1 to 25% above said resolution limit.

12. The reticle design of claim 4 wherein said lines comprise chrome.

13. The reticle design of claim 4 wherein said lines are of a width to provide line widths on said wafer from about 1.2 $\mu$m and less and spacing of said lines on said wafer from about 1.0 $\mu$m and less at nominal exposure.

* * * * *